(12) United States Patent
Wu et al.

(10) Patent No.: US 6,423,600 B1
(45) Date of Patent: Jul. 23, 2002

(54) METHOD FOR FORMING UNIFORM OXIDE THICKNESS

(75) Inventors: Chao-chueh Wu; Chuchun Hu, both of Hsinchu (TW)

(73) Assignee: ProMos Technologies, Inc., Hsinshu (TW)

( * ) Notice: Subject to any disclaimer, the term of this patent is extended or adjusted under 35 U.S.C. 154(b) by 0 days.

(21) Appl. No.: 09/658,190

(22) Filed: Sep. 8, 2000

(51) Int. Cl.[7] .............................................. H01L 21/336
(52) U.S. Cl. ...................... 438/303; 438/299; 438/301; 438/514; 438/756
(58) Field of Search .................. 438/762, 749, 438/754, 755, 756, 757, 753, 264, 263, 530, 449, 275, 229–232, 289, 299, 301, 303, 305–307, 514, 981; 257/412, 344, 408, 413

(56) References Cited

U.S. PATENT DOCUMENTS 5,625,217 A * 4/1997 Chau et al. ................. 257/412
5,744,391 A * 4/1998 Chen ........................... 438/264
5,851,888 A * 12/1998 Gardner et al. .............. 438/301
6,074,960 A * 6/2000 Lee et al. .................... 438/749
6,159,806 A * 12/2000 Chern et al. ................. 438/275

* cited by examiner

*Primary Examiner*—Caridad Everhart
*Assistant Examiner*—Victor Yevsikov

(57) ABSTRACT

A method for manufacturing a transistor device that includes forming an oxide layer over a substrate, forming a gate structure over the oxide layer, depositing a silicon nitride layer over the oxide layer and the gate structure, anisotropic etching the silicon nitride layer to remove portions of the silicon nitride layer, wherein remaining portions of the silicon nitride layer form nitride spacers contiguous with the gate structure, and a portion of the oxide layer beneath the removed portions of the silicon nitride layer is also removed, cleaning oxide layer, applying a diluted hydrogen fluoride solution to the oxide layer to form a substantially uniform thickness of the oxide layer, and implanting ions through the oxide layer having a substantially uniform thickness to form source and drain regions of the transistor device.

7 Claims, 2 Drawing Sheets

METHOD FOR FORMING UNIFORM OXIDE THICKNESS

BACKGROUND OF THE INVENTION

1. Field of the Invention

This invention pertains in general to a method for manufacturing a semiconductor device and, more particularly, to a method for forming a substantially uniform silicon oxide thickness.

2. Description of the Related Art

In a semiconductor manufacturing process, the uniformity of the thickness of a dielectric layer may affect ion implantation performance because ions are often implanted through a dielectric layer. An example is in the formation of source and drain regions of a transistor, such as a dynamic random access memory (DRAM) transistor.

Conventionally, a layer of silicon dioxide is formed over a silicon substrate. A polysilicon layer is deposited over the silicon dioxide layer, and a layer of metal silicide is deposited over the polysilicon layer. A cap nitride layer is then deposited over the metal silicide layer. After the polysilicon/metal silicide/cap nitride layer is patterned and etched to form a gate structure, a layer of silicon nitride is deposited over and around the sides of the gate structure. The silicon nitride layer is also deposited on portions of the silicon dioxide layer not covered by the gate structure. Anisotropic etch, such as plasma etch, is performed on the silicon nitride layer to remove the horizontal portion of the silicon nitride layer deposited over the silicon dioxide layer and the top of the gate structure. The remained portions of the silicon nitride layer are formed as "nitride spacers," which act as masks during subsequent ion implantation to form the source and drain regions of the transistor. The nitride spacers prevent the gate structure from overlapping with either the drain region or source region.

During the anisotropic etch process, however, a portion of the silicon dioxide layer directly beneath the removed portions of the silicon nitride layer may be damaged by the plasma. A damaged silicon dioxide layer may exhibit non-uniform thickness. Because ions are implanted through the damaged silicon dioxide layer in order to form source and drain regions of the transistor, the non-uniformity thickness of the silicon dioxide layer may cause inconsistent implantation performance, such as inconsistent implant depths. Furthermore, having source and drain regions extend too far into the silicon substrate or having source and drain regions not extending far enough into the silicon substrate will result in the transistor not operating within specified electrical specifications. Furthermore, such inconsistency will generally adversely affect the yield of the manufacturing process.

SUMMARY OF THE INVENTION

Accordingly, the present invention is directed to a method for forming a substantially uniform oxide thickness that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structures and methods particularly pointed out in the written description and claims hereof, as well as the appended drawings.

To achieve these and other advantages, and in accordance with the purpose of the invention as embodied and broadly described, there is provided a method for manufacturing a transistor device that includes forming an oxide layer over a substrate, forming a gate structure over the oxide layer, depositing a silicon nitride layer over the oxide layer and the gate structure, anisotropic etching the silicon nitride layer to remove portions of the silicon nitride layer, wherein remaining portions of the silicon nitride layer form nitride spacers contiguous with the gate structure, and a portion of the oxide layer beneath the removed portions of the silicon nitride layer is also removed, cleaning the oxide layer, applying a diluted hydrogen fluoride solution to the oxide layer to form a substantially uniform thickness of the oxide layer, and implanting ions through the oxide layer having a substantially uniform thickness to form source and drain regions of the transistor device.

In one aspect of the invention, the step of applying a diluted hydrogen fluoride includes applying a hydrogen fluoride solution having a diluted hydrogen fluoride concentration of approximately one part hydrogen fluoride to 500 parts water.

In another aspect of the invention, the step of applying a diluted hydrogen fluoride includes applying a hydrogen fluoride solution having a diluted hydrogen fluoride concentration of approximately one part hydrogen fluoride to 400 parts water.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DETAILED DESCRIPTION OF THE PREFERRED EMBODIMENTS

Figure 1A:
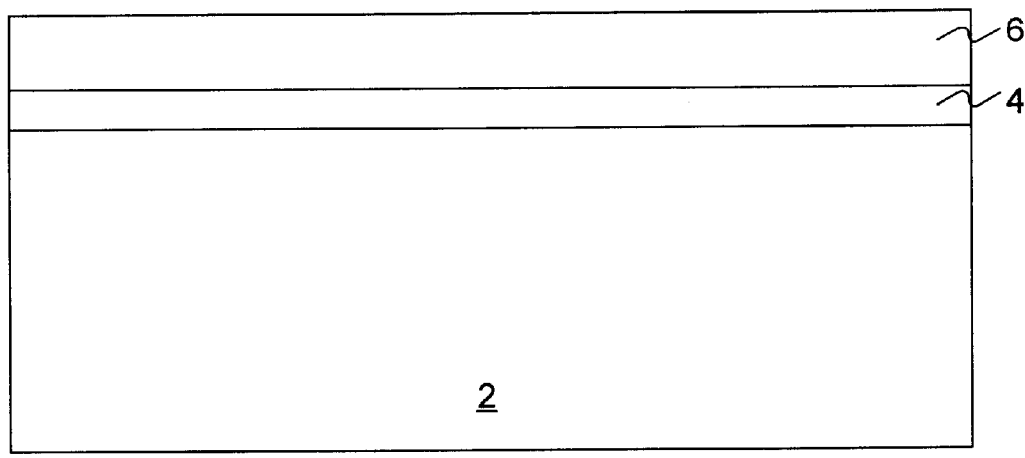
FIGS. 1A–1D show the manufacturing process for forming a transistor having a substantially uniform oxide thickness in accordance with the present invention.

In accordance with the present invention, there is provided a method for forming a transistor having a substantially uniform oxide thickness. FIGS. 1A–1D show the manufacturing process for forming a transistor having a substantially uniform oxide thickness in accordance with the present invention. Referring to FIG. 1A, a layer of oxide 4, such as silicon dioxide ($SiO_2$), is formed over a silicon substrate 2. Oxide layer 4 may be formed by depositing a layer of silicon dioxide through any known chemical-vapor deposition ("CVD") process, or growing a layer of silicon dioxide through thermal oxidation.

Figure 1B:
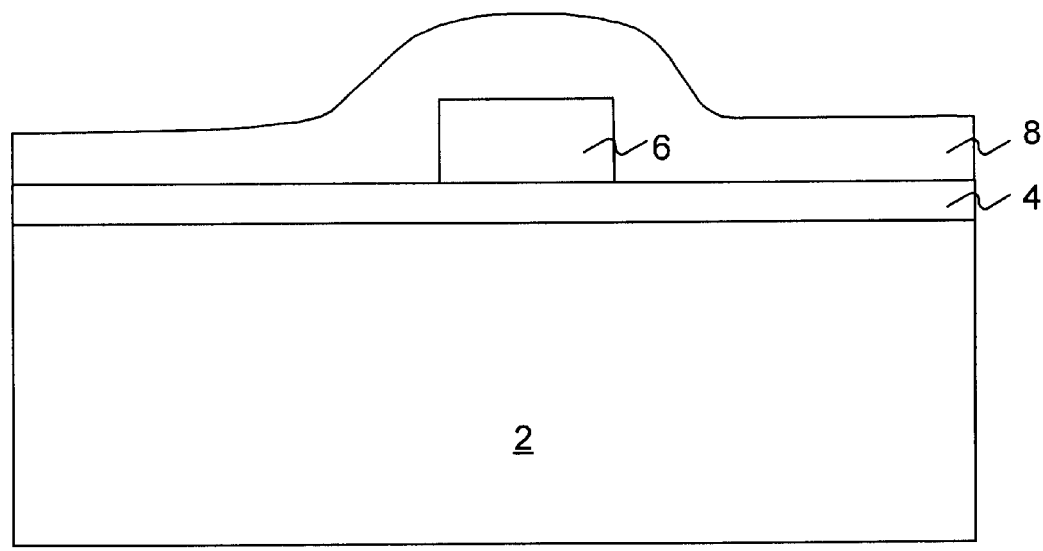

A layer of polysilicon is deposited over oxide layer 4, and a layer of metal silicide, such as tungsten silicide, is deposited over the polysilicon layer. A cap nitride layer is then deposited over the metal silicide layer. The polysilicon/metal silicide/cap nitride composite layer 6 is disposed over oxide layer 4 to form the gate structure of a transistor, such as a DRAM transistor. A photoresist layer (not shown) is deposited over composite layer 6 to define and pattern composite layer 6 to expose portions of composite layer 6. The exposed portions of the polysilicon layer are etched to form a gate structure 6 as shown in FIG. 1B. The photoresist is then stripped. A silicon nitride layer 8 is deposited over oxide layer 4 and gate structure 6 with any known CVD process. Silicon nitride layer 8 is deposited over and around the sides of gate structure 6.

Figure 1C:
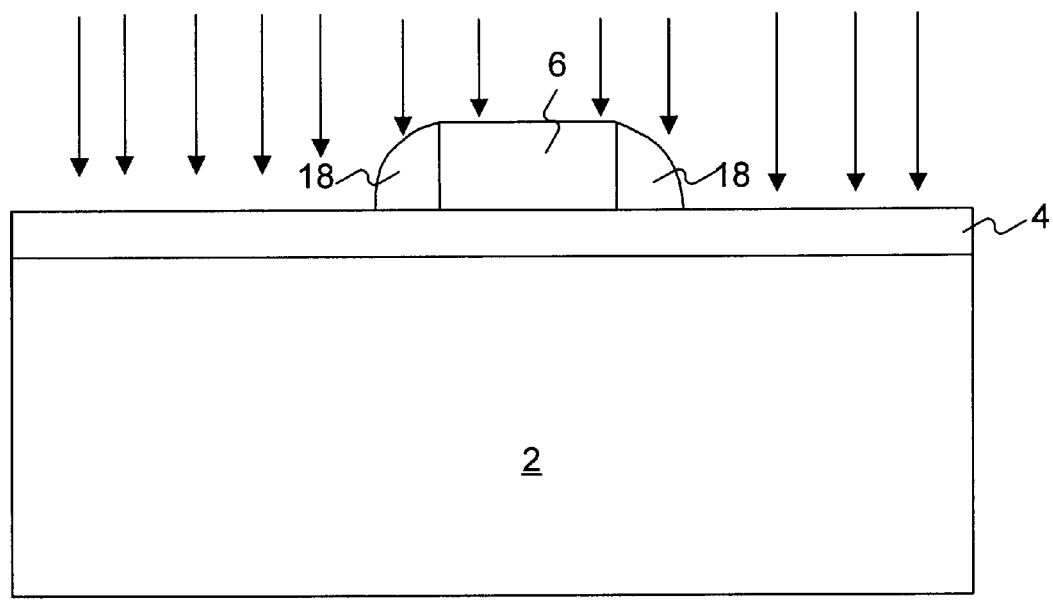

Anisotropic etch, such as plasma etch, is then performed on silicon nitride layer 8 to remove portions of the silicon nitride layer. Referring to FIG. 1C, because of the characteristics of anisotropic etching, portions of silicon nitride layer 18 contiguous with gate structure 6 remain after the etching step, even though all of nitride layer 8 overlying oxide layer 4 and the top of gate structure 6 are removed. The remained portions of silicon nitride layers 18 are known as "nitride spacers." As shown in FIG. 1C, gate structure 6, together with nitride spacers 18, act as masks during subsequent ion implantation steps to form the source and drain regions of the transistor. Oxide layer 4, nitride spacers 18 and gate structure 6 are cleaned by wet clean following the anisotropic etch.

Figure 1D:
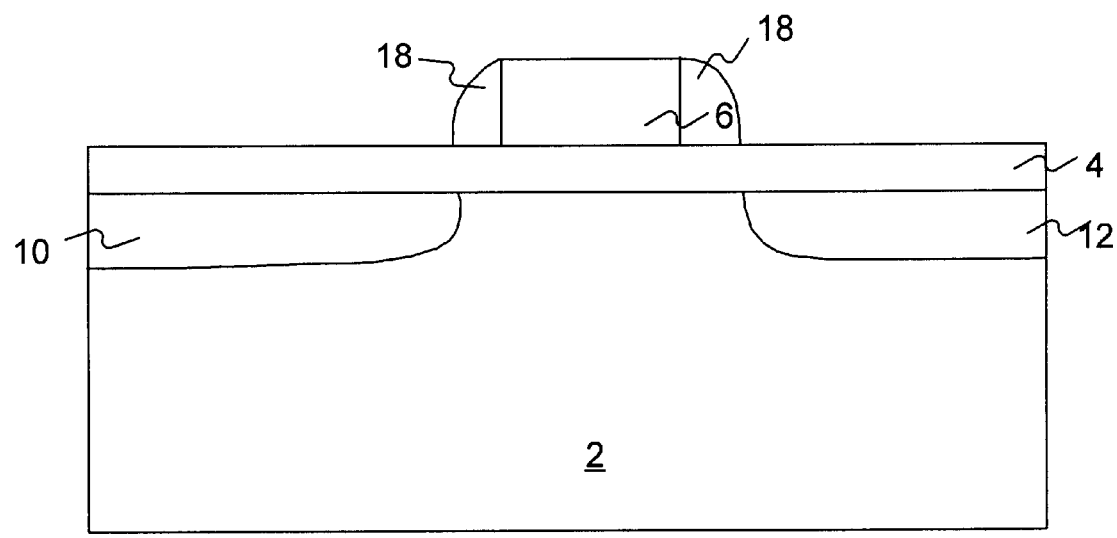

Referring to FIG. 1D, nitride spacers 18 prevent gate structure 6 from overlapping with either the drain region 10 or the source region 12. In one embodiment of the present invention, source and drain regions of a PFET (P-type, Field-Effect Transistor) are formed.

During the anisotropic etching process, however, the oxide layer underneath the removed portions of the silicon nitride layer is also exposed to the plasma. Therefore, a portion of the oxide layer is removed and become damaged by the plasma. Damaged oxide layer 4 may exhibit non-uniform thickness, which may affect the performance of subsequent implantation steps relating to the formation of the source and drain regions of the transistor. To remove the damaged portions of the oxide layer, a diluted hydrogen fluoride (HF) solution is applied.

In one embodiment of the present invention, the hydrogen fluoride solution is diluted to a concentration of approximately one part hydrogen fluoride to 500 parts water. In another embodiment of the present invention, the hydrogen fluoride solution is diluted to a concentration of approximately one part hydrogen fluoride to 400 parts water. Because the hydrogen fluoride solution is diluted to the concentration described, only the damaged oxide is removed and gate structure 6 and nitride spacers 18 are not affected. The diluted hydrogen fluoride removes the damaged portions of the oxide layer to obtain a uniform and consistent oxide thickness. This is shown in the following tables showing the results of two experiments:

(1) For a manufacturing process without applying a diluted hydrogen fluoride solution after silicon nitride etch:

| Wafer ID No. | Oxide Thickness (Å) |
| --- | --- |
| 2 | 132 |
| 6 | 128 |
| 17 | 60 |
| 20 | 62 | wherein the latter two wafers (ID Nos. 17 and 20) were etched for four seconds longer than the first two wafers (ID Nos. 2 and 6).

(2) For a manufacturing process applying a 400:1 diluted hydrogen fluoride solution for 15 to 36 seconds after silicon nitride etch:

| Wafer ID No. | Oxide Thickness (Å) |
| --- | --- |
| 9 | 38 |
| 13 | 40 |
| 15 | 39 |
| 11 | 43 |
| 12 | 38 |

In the same experiment in which the diluted hydrogen fluoride solution was applied for 240 seconds, an oxide thickness of 2 Å resulted. This result indicates that diluted hydrogen fluoride should not be applied to the oxide layer for a prolonged period of time, but the result also indicates a wide process window. So long as there is not prolonged contact between the diluted hydrogen fluoride and oxide layer, the oxide thickness is easy to control.

An ion implantation step follows to implant ions through the oxide layer, while the nitride spacers and the gate structure prevent the ions from penetrating through to the substrate. Because the oxide layer exhibits a uniform and consistent thickness, the ion implantation step yields consistent implant depths, and, therefore, consistent electrical characteristics of the semiconductor device, which improve yield of the manufacturing process in general.

Conventional manufacturing steps then follow to complete the formation of the transistor and, ultimately, the semiconductor product.

It will be apparent to those skilled in the art that various modifications and variations can be made in the disclosed process and product without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for manufacturing a transistor device, comprising:

forming an oxide layer over a substrate;

forming a gate structure over the oxide layer;

depositing a silicon nitride layer over the oxide layer and the gate structure;

anisotropic etching the silicon nitride layer to remove portions of the silicon nitride layer, wherein remaining portions of the silicon nitride layer form nitride spacers contiguous with the gate structure, and a portion of the oxide layer beneath the removed portions of the silicon nitride layer is also removed;

cleaning the oxide layer;

applying a diluted hydrogen fluoride solution to the oxide layer to form a substantially uniform thickness of the oxide layer; and implanting ions through the oxide layer having a substantially uniform thickness to form source and drain regions of the transistor device.

2. The method as claimed in claim 1, wherein the step of applying a diluted hydrogen fluoride includes applying a hydrogen fluoride solution having a diluted hydrogen fluoride concentration of approximately one part hydrogen fluoride to 500 parts water.

3. The method as claimed in claim 1, wherein the step of applying a diluted hydrogen fluoride includes applying a hydrogen fluoride solution having a diluted hydrogen fluoride concentration of approximately one part hydrogen fluoride to 400 parts water.

4. The method as claimed in claim 1, wherein the step of forming an oxide layer includes thermal oxidation.

5. The method as claimed in claim 1, wherein the step of cleaning an oxide layer includes wet clean.

6. The method as claimed in claim 1, wherein the step of anisotropically etching inludes plasma etch.

7. The method as claimed in claim 1 wherein the step of forming a gate structure over the oxide layer includes depositing a polysilicon layer over the oxide layer;

depositing a metal silicide layer over the polysilicon layer;

depositing a cap nitride layer over the tungsten silicide layer;

depositing a photoresist layer over the cap nitride layer, defining and patterning the photoresist layer to expose portions of the polysilicon layer, etching the portions of the polysilicon layer, and stripping the photoresist layer.

\* \* \* \* \*